United States Patent
Jesorka et al.

(10) Patent No.: US 9,835,949 B2
(45) Date of Patent: Dec. 5, 2017

(54) LITHOGRAPHIC PATTERN DEVELOPMENT PROCESS FOR AMORPHOUS FLUOROPOLYMER

(71) Applicants: Aldo Jesorka, Gothenburg (SE); Mehrnaz Shaali, Gothenburg (SE)

(72) Inventors: Aldo Jesorka, Gothenburg (SE); Mehrnaz Shaali, Gothenburg (SE)

(73) Assignee: Aldo Jesorka, Göteborg (SE)

( * ) Notice: Subject to any disclaimer, the term of this patent is extended or adjusted under 35 U.S.C. 154(b) by 0 days.

(21) Appl. No.: 14/017,323

(22) Filed: Sep. 4, 2013

(65) Prior Publication Data

US 2014/0065551 A1 Mar. 6, 2014

Related U.S. Application Data

(60) Provisional application No. 61/697,379, filed on Sep. 6, 2012.

(51) Int. Cl.
 *G03F 7/32* (2006.01)
 *G03F 7/20* (2006.01)

(52) U.S. Cl.
 CPC . *G03F 7/32* (2013.01); *G03F 7/20* (2013.01)

(58) Field of Classification Search
 CPC .......................................................... G03F 7/32
 USPC .................................. 430/296, 325, 331, 942
 See application file for complete search history.

(56) References Cited

U.S. PATENT DOCUMENTS 6,855,646 B2 * 2/2005 Awad et al. .................. 438/780

\* cited by examiner

*Primary Examiner* — Christopher Young

(57) ABSTRACT

Here we disclose a lithographic pattern development process for amorphous fluoropolymers. Amorphous fluoropolymers are a class of plastic materials with high chemical inertness and favorable optical properties. Exposure of surface-deposited layers of such polymer with high energy radiation leads to a change in the chemical structure of the polymer, which selectively compromises the solubility of the exposed areas in fluorinated organic solvents. Micro- and nanopatterning with a feature size down to <50 nm was achieved by dissolving and removing unexposed amorphous fluoropolymer from exposed, surface deposited films. The amorphous fluoropolymer functions thus as a negative resist.

2 Claims, 6 Drawing Sheets

Top view | Side view

LITHOGRAPHIC PATTERN DEVELOPMENT PROCESS FOR AMORPHOUS FLUOROPOLYMER

BACKGROUND OF THE INVENTION

Amorphous fluoropolymers are a class of plastic materials with low surface energy and low dielectric constant that are characterized as exceptionally chemically inert and thermally stable due to their strong carbon-fluorine and carbon-carbon bonds. Most of these polymers have low reflective index with high transparency in a wide range of wavelength from 200 to 2000 nm. Amorphous fluoropolymers are widely used in different fields such as coatings in optics, insulators in electronics, protection material in chemical industries, and semiconductors. [1]

Applying amorphous fluoropolymers in nano devices is in high demand for many emerging high-tech applications; especially in pharmaceutical products, and electronics. So far, all currently available techniques to pattern amorphous fluorinated polymers are based on etching by high energy radiation sources, such as focused laser light, resulting in micro structures with aspect ratios less than 2; synchrotron radiation, giving micro structures which reach aspect ratios between 10 and 70; focused ion beams, with 5 nm spatial resolution. In addition, high doses of electron beam radiation have been reported to cause photodegradation of the polymer with ~200 nm feature resolution. [2-4]

However, lithography-based nano-patterning of fluorinated polymers still remains a challenge, mainly because of the chemical inertness. No suitable solvents to chemically etch, or develop this type of polymer have been reported.

The method presented here is a novel approach to achieve patterning of fluoropolymer surfaces with micrometer and submicrometer feature resolution by means of chemically developing surface-deposited and high-energy radiation exposed films of such polymers in the fashion of a negative lithographic resist process.

SUMMARY OF THE INVENTION

This invention provides a method to create patterns of amorphous fluoropolymer on a solid substrate. The invention detailed here allows for the generation of amorphous fluoropolymer patterns on surfaces, featuring high resolution with feature sizes ranging from the micrometer to the low nanometer size scale. This pattern generation is achieved by treating thin films of amorphous fluoropolymer, which are previously exposed to high energy radiation, with a developer. The developer is chosen to selectively dissolve the unexposed polymer areas, while leaving the exposed areas unchanged. In order to obtain patterned surfaces, an amorphous fluoropolymer film is deposited on a solid substrate, exposed with a pre-defined pattern, and developed to liberate the desired pattern on the substrate surface. The procedure follows the principle of a negative lithographic resist, i.e., unexposed resist is removed from the substrate surface in the development process, and only the exposed areas remain on the substrate. A change in chemical structure, i.e., chemical degradation, of the exposed polymer, which is caused by the high-energy radiation, is responsible for a decrease in solubility in the developer that we use to produce the fluoropolymer pattern on the surface.

In the first aspect, an amorphous fluoropolymer film is deposited as a thin layer on a solid substrate.

In one embodiment, the amorphous fluoropolymer is Teflon AF.

In one preferred embodiment, the amorphous fluoropolymer is Teflon AF 1600.

In another preferred embodiment, the amorphous fluoropolymer is Teflon AF 2400.

In one aspect, the solid substrate is transparent.

In a preferred embodiment, the transparent substrate is glass, quartz or mica.

In a preferred embodiment, the transparent substrate is plastics.

In one aspect, the solid substrate is opaque.

In one embodiment, the opaque substrate is a metal, semiconductor, glass or ceramics.

In one preferred embodiment, the opaque substrate is Silicon (Si).

In another embodiment, the opaque substrate is Silicon oxide (SiO2).

In another embodiment, the opaque substrate is Silicon carbide (SIC).

In another embodiment, the opaque substrate is Silicon-germanium (SiGe).

In another embodiment, the opaque substrate is germanium (Ge).

In another embodiment, the opaque substrate is gallium-antimonide (GaSb).

In another embodiment, the opaque substrate is gallium-arsenide (GaAs).

In another embodiment, the opaque substrate is gallium phosphide (GaP).

In another embodiment, the opaque substrate is gallium-nitride (GaN).

In another embodiment, the opaque substrate is indium phosphide (InP).

In another embodiment, the opaque substrate is indium arsenide (InAs).

In another embodiment, the opaque substrate is indium antimonide (InSb).

In another embodiment, the opaque substrate is cadmium selenide (CdSe).

In another embodiment, the opaque substrate is cadmium telluride (CdTe).

In another embodiment, the opaque substrate is cadmium sulphide (CdS).

In another embodiment, the opaque substrate is zinc selenide (ZnSe).

In another embodiment, the opaque substrate is zinc sulphide (ZnS).

In another embodiment, the opaque substrate is zinc telluride (ZnTe).

In another embodiment, the opaque substrate is zinc oxide (ZnO).

In another embodiment, the opaque substrate is Strontium titanate (SrTiO3).

In one aspect, the solid substrate is coated with a thin-film.

In one embodiment, the solid substrate is coated with a conductive thin-film.

In one preferred embodiment, the solid substrate is coated with an oxide.

In another preferred embodiment, the solid substrate is coated with tin doped indium oxide (ITO).

In another embodiment, the solid substrate is coated with zinc oxide (ZnO).

In another embodiment, the solid substrate is coated with aluminum doped zinc oxide (ZnO:Al).

In another embodiment, the solid substrate is coated with gallium doped zinc Oxide (ZnO:Ga).

In another embodiment, the solid substrate is coated with is indium doped zinc oxide (IZO).

In another embodiment, the solid substrate is coated with indium doped cadmium oxide (ICO).

In one preferred embodiment, the solid substrate is coated with a nitride.

In another embodiment, the solid substrate is coated with graphene.

In another embodiment, the solid substrate is coated with carbon nano fibers.

In another embodiment, the solid substrate is coated with a metal.

In another embodiment, the solid substrate is coated with a polymer.

In one preferred embodiment, the solid substrate is coated with Poly(3,4-ethylenedioxythiophene) (PEDOT).

In another preferred embodiment, the solid substrate is coated with Poly(3,4-ethylenedioxythiophene) doped with polystyrene sulfonate (PEDOT: PSS).

In another embodiment, the solid substrate is coated with poly(4,4 dioctylcyclopentadithiophene).

In another embodiment, the solid substrate is coated with Poly(4,4-dioctylcyclopentadithiophene) doped with iodine.

In another embodiment, the solid substrate is coated with Poly(4,4 dioctylcyclopentadithiophene) doped with 2,3-dichloro-5,6-dicyano-1,4-benzoquinone (DDQ).

In one aspect, the thin layer of amorphous fluoropolymer is fabricated by a common thin film deposition method.

In one embodiment, the thin layer of amorphous fluoropolymer is fabricated spin coating.

In a preferred embodiment, the thin layer of amorphous fluoropolymer is fabricated by spin coating, for which the amorphous fluoropolymer is applied as a solution of Teflon AF 1600 in a fluorinated solvent.

In another preferred embodiment, the thin layer of amorphous fluoropolymer is fabricated by spin coating, for which the amorphous fluoropolymer is applied as a solution of Teflon AF 2400 in a fluorinated solvent.

In another embodiment, the thin layer of amorphous fluoropolymer is fabricated by meniscus coating.

In another embodiment, the thin layer of amorphous fluoropolymer is fabricated by capillary coating.

In another embodiment, the thin layer of amorphous fluoropolymer is fabricated by extrusion coating.

In another embodiment, the thin layer of amorphous fluoropolymer is fabricated by patch coating.

In another embodiment, the thin layer of amorphous fluoropolymer is fabricated by extrude-and-spin coating.

In one aspect, the thickness of amorphous fluoropolymer film is in the range of 10 nm-50 nm.

In one aspect, the thickness of amorphous fluoropolymer film is in the range of 50 nm-250 nm.

In another aspect, the thickness of amorphous fluoropolymer film is in the range of 250 nm-5 µm.

In another aspect, the thickness of amorphous fluoropolymer film is in the range of 5 µm-500 µm.

In one aspect, the thin Layer of amorphous fluoropolymer is exposed by high energy radiation.

In one aspect, the source of radiation is an electron beam.

In another aspect, the source of radiation is an x-ray beam.

In another aspect, the source of radiation is synchrotron radiation.

In another aspect, the source of radiation is a focused ion beam.

In another aspect, the source of radiation is a laser beam.

In one main aspect, the amorphous fluoropolymer film is brought in contact with a fluid developer to achieve development.

In one main aspect, the exposed amorphous fluoropolymer film is developed with a fluorinated hydrocarbon solvent.

In a preferred embodiment, the fluorinated solvent is Perfluoro (2-butyltetrahydrofuran).

In one embodiment, the fluorinated solvent is perfluorononane ($C_9F_{20}$).

In another embodiment, the fluorinated solvent is perfluoro-2-butyltetrahydrofuran ($C_8F_{16}O$)

In another embodiment, the fluorinated solvent is Hexafluorobenzene ($C_6F_6$).

In another embodiment, the fluorinated solvent is perfluorodecalin ($C_{10}F_{18}$).

In another embodiment, the fluorinated solvent is perfluorooctyl bromide ($C_8BrF_{17}$).

In another embodiment, the fluorinated solvent is 2H,3H-Decafluoropentane ($C_5H_2F_{10}$).

In another embodiment, the fluorinated solvent is benzotrifluorde ($C_7H_5F_3$).

In another embodiment, the fluorinated solvent is octafluorotoluene ($C_7F_8$).

In another embodiment, the fluorinated solvent is hexadecafluoroheptane ($C_7F_{16}$).

In another embodiment, the fluorinated solvent is Hexadecafluoro(1,3-dimethylcyclohexane)

In another embodiment, the fluorinated solvent is perfluoro-1,3-dimethylcyclohexane ($C_8F_{16}$).

In another embodiment, the fluorinated solvent is 2H,3H-Decafluoropentane.

In one embodiment, the fluorinated solvent is (trifluoromethyl)-, 1-butanamine.

In one aspect, the exposed amorphous fluoropolymer film is developed with a mixture of different solvents.

In one preferred embodiment, the mixture is composed of Perfluoro (2-butyltetrahydrofuran) and hexadecafluoroheptane.

In one embodiment, the mixing ratio is in a range between 10:1 and 1:10.

In one preferred embodiment, the mixing ratio is 1:1.

In one aspect, the developer is applied by a spraying or nebulizing technique.

In another aspect, the developer is applied by a dipping or immersion technique.

In another aspect, the developer is applied by a flow technique.

In another aspect, the developer is applied locally by a microflow device.

In one aspect the contact between the exposed fluoropolymer layer and the developer is kept for a determined period of time to achieve development.

In one embodiment, the development time comprises a duration between 1 second and 10 minutes.

In a preferred embodiment, the development time is 30 seconds.

In another preferred embodiment, the development time is 2 minute.

In one aspect, the developer is held at a determined temperature between melting point and flash point during development.

In a preferred embodiment, the development temperature is fixed at 20° C.

In another embodiment, the development temperature is fixed at 60° C.

In another embodiment, the development temperature is changed from 20° C. to 60° C. during the development.

In one aspect, the substrate carrying the exposed amorphous fluoropolymer film is held still during development.

In another aspect, the substrate carrying the exposed amorphous fluoropolymer film is agitated during development.

In another aspect, the substrate carrying the exposed amorphous fluoropolymer film is sonicated during development.

DEFINITIONS

Unless defined otherwise, all technical and scientific terms used herein have the meaning commonly understood by a person skilled in the art to which this invention belongs. The following references provide one of skill with a general definition of many of the terms used in this invention: The Cambridge Dictionary of Science and Technology (Walker ed., 1988), Britannica encyclopedia/Academic Edition online. As used herein, the following terms have the meanings ascribed to them below, unless specified otherwise. In this disclosure, "comprises," "comprising," "containing" and "having" and the like can have the meaning ascribed to them in U.S. Patent law and can mean "includes," "including," and the like; "consisting essentially of" or "consists essentially" likewise has the meaning ascribed in U.S. Patent law and the term is open-ended, allowing for the presence of more than that which is recited so long as basic or novel characteristics of that which is recited is not changed by the presence of more than that which is recited, but excludes prior art embodiments.

By "fluoropolymer" is meant to refer to a carbon polymer containing a large portion of carbon-fluorine bonds in its repeating monomer.

By "amorphous fluoropolymer" is meant to refer a fluoropolymer in which the molecules are oriented randomly.

By "negative lithographic resist" is meant to refer to a chemical that is sensitive to interaction with radiation in a way that its solubility in a developer decreases when exposed to electromagnetic or particle radiation.

By "exposure" is meant to refer to the interaction of radiation and radiation-sensitive resist, which defines the exposed (irradiated) areas in a lithographic resist film.

By "radiation" is meant to refer to the propagation of energy in the form of waves, rays or particles.

By "high energy radiation" is meant to refer to the radiation with energy of more than one thousand electron volts.

By "thin film" is meant to refer to a layer of material with thickness less than one millimeter.

By "pattern" is meant to refer to the design made up of an arrangement of regular shapes, such as lines, circles, squares, polygons, or irregular shapes, which is typically repeated at regular intervals over the substrate surface.

By "chemical degradation" is meant to refer to a chemical process by which a compound is broken down into molecular or atomic fragments.

By "aspect ratio" is meant to refer to the ratio between the height and the width of a structure.

By "resolution" is meant to refer to the minimum distance at which features can be distinguished as individuals. The resolution is limited by the width of the exciting beam and by the interaction volume in a solid.

By "feature size" is meant to refer to the size of one or more individual elements of a pattern.

By "development" is meant to refer to a process which liberates the pattern from the lithographic resist film after exposure.

By developer is meant to refer to a liquid or fluid which is used to achieve development, typically by dissolving and removing the exposed (positive developer) or unexposed (negative developer) areas in the lithographic resist film.

By "fluorinated solvent" is meant to refer to a hydrocarbon solvent in which some or all of the hydrogen atoms are replaced by fluorine atoms.

By "Perfluorinated solvent" is meant to refer to a hydrocarbon solvent in which all of the hydrogen atoms are replaced by fluorine atoms.

By "microflow device" is meant to refer to a microscale device controlling or sensing flow in the order of µl/min to nl/min.

By "substrate" is meant to refer to the material on which a process is conducted.

By "coating" is meant to refer to a thin layer of something spreads over a substrate or surface.

BRIEF DESCRIPTION OF DRAWINGS

In the accompanying drawings:

FIG. 1A illustrates the top view of a clean solid substrate.

FIG. 1B illustrates the top view of a clean solid substrate coated with a thin layer of a transparent conductive coating.

FIG. 1C illustrates the top view of a solid substrate after coating with a thin layer of a transparent conductive coating and a thin layer of an amorphous fluoropolymer.

FIG. 1D illustrates the top view of a coated substrate after exposure by high energy radiation, defining the pattern.

FIG. 1E illustrates the side view of a coated and exposed substrate after development with developer.

FIG. 1F illustrates the side view of a clean solid substrate.

FIG. 1G illustrates the side view of a clean solid substrate coated with a thin layer of a transparent conductive coating.

FIG. 1H illustrates the side view of a solid substrate after coating with a thin layer of a transparent conductive coating and a thin layer of an amorphous fluoropolymer.

FIG. 1I illustrates the side view of a coated substrate after exposure by high energy radiation, defining the pattern.

FIG. 1J illustrates the side view of a coated and exposed substrate after development with developer.

FIG. 2C shows schematically pattern development by dipping of the exposed substrate into developer.

FIG. 2D shows schematically pattern development by spraying the exposed substrate with developer.

FIG. 2E shows schematically localized pattern development by means of a micropipette and a controlled flow of developer.

DESCRIPTION OF THE DRAWINGS

FIG. 1 displays the process of substrate preparation, comprising spin coating of an amorphous fluoropolymer onto a solid substrate. For clarity both plane and profile views are presented. The clean solid substrate (0100) is coated with a thin layer of a transparent conductive coating (0101) and then a thin layer of an amorphous fluoropolymer (0102) is spun on top of the coating. The desired pattern is exposed by electron beam radiation (0103). After development all the unexposed areas is dissolved into the developer and only exposed areas are remained (0104).

FIG. 2 provides an exemplary illustration of the set-up of the method. The coated solid substrate (0200) is placed on a spin-coater (0201) which rotates at a specific speed (0202). The amorphous fluoropolymer (0203) is put onto the substrate by a pipette (0204). The solid substrate covered by fluoropolymer (0205) is exposed by a high energy radiation (0207) producing the desired pattern (0206) at exposed areas. After exposure the substrate can be dipped into a container (0208) filled with the fluorinated hydrocarbon solvent as developer (0209), or the fluorinated hydrocarbon solvent can be sprayed (0210) by a nozzle (0211) placed above the exposed areas. The developer can also be applied by localized developing system including a micropipette (0212) and a controlled flow of developer (0213). After development, all the unexposed fluoropolymer is dissolved by the developer and only the exposed fluoropolymer (2014) is remained on the surfaces, surrounding by transparent conductive coating (2015).

Figure 3A:
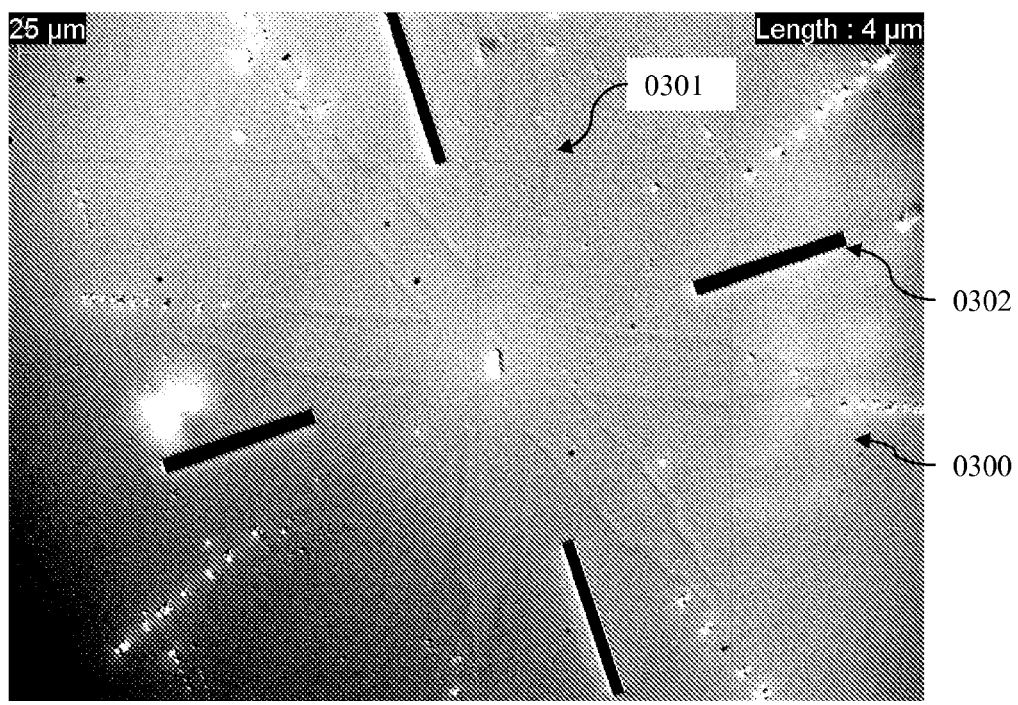
FIG. 3A shows an optical microscopy image of a patterned amorphous fluoropolymer substrate after exposure by electron beam radiation.
Figure 3B:
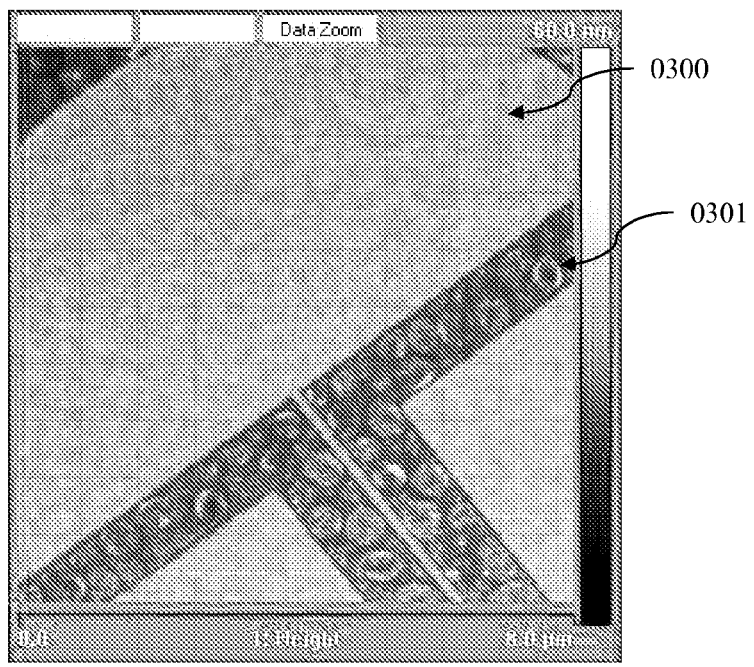
FIG. 3B shows an atomic force 2D micrograph of a patterned amorphous fluoropolymer substrate after exposure by electron beam radiation.
Figure 3C:
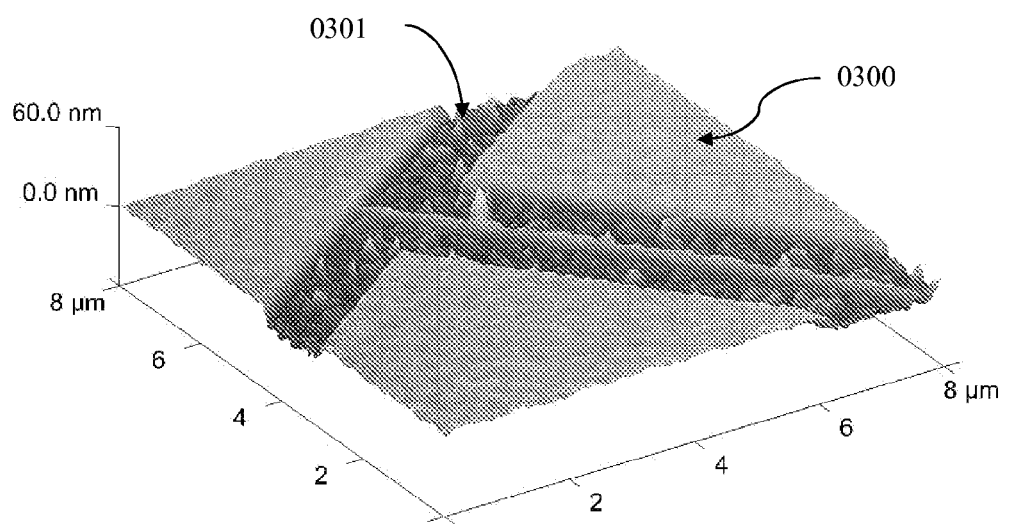
FIG. 3C shows an atomic force 3D micrograph of a patterned amorphous fluoropolymer substrate after exposure by electron beam radiation.

FIG. 3 shows optical microscopic image (FIG. 3A) and atomic force 2D and 3D macrographs (FIG. 3B and FIG. 3C) of a patterned amorphous fluoropolymer exposed by electron beam radiation. An amorphous fluoropolymer is spun onto a solid substrate (0300) and desired pattern is exposed by e-beam radiation (0301). Gold alignment marks (0302) are used to find the structure easier.

FIG. 4 shows optical microscopic image (FIG. 3A) and atomic force 2D and 3D macrographs (FIG. 3B and FIG. 3C) of e-beam exposed amorphous fluoropolymer after development by fluorinated hydrocarbon developer. After development only exposed areas of amorphous fluoropolymer (0401) remain on the transparent conductive coating (0400) while the rest of unexposed fluoropolymer is removed by the developer. Gold alignment marks (0402) are used to find the structure easier.

DETAILED DESCRIPTION

The embodiments of this method provide means for the generation of amorphous fluoropolymer patterns on solid surfaces, featuring high resolution with feature sizes ranging from the micrometer to the low nanometer size scale.

Figure 1A:
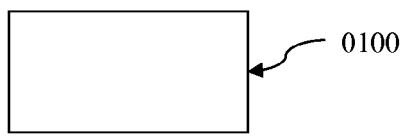
FIGS. 1A-1E show schematically top views of the substrate in the process of substrate preparation and surface patterning.
Figure 1F:
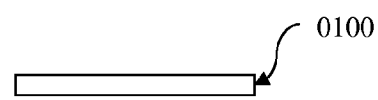
FIGS. 1F-1J show schematically side views of the substrate in the process of substrate preparation and surface patterning.
Figure 1B:
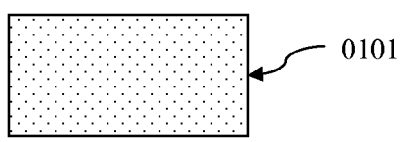
Figure 1G:
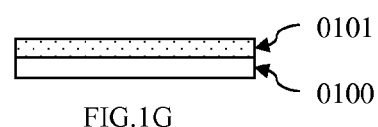
Figure 1C:
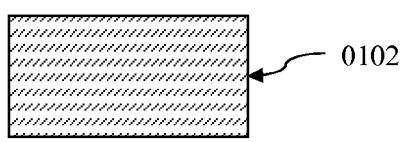
Figure 1H:
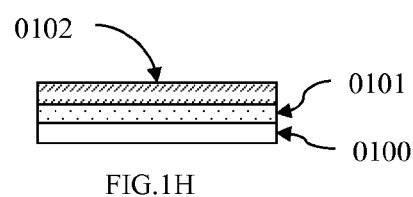
Figure 1D:
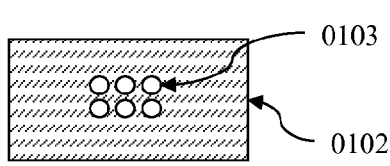
Figure 1I:
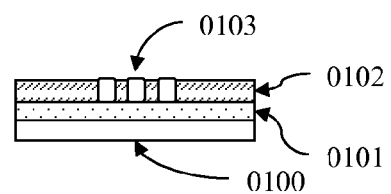
Figure 1E:
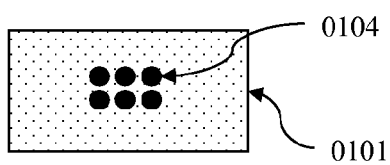
Figure 1J:
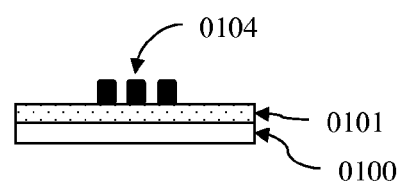
Figure 2A:
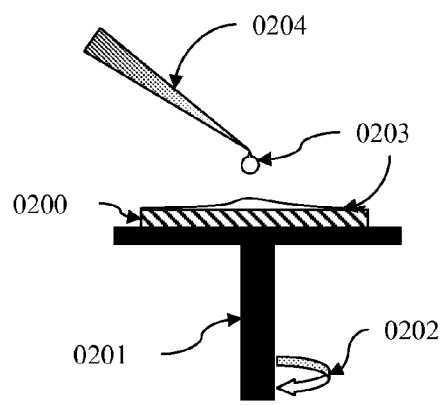
FIG. 2A illustrates schematically a set-up to deposit a thin layer of an amorphous fluoropolymer onto a solid substrate.
Figure 2B:
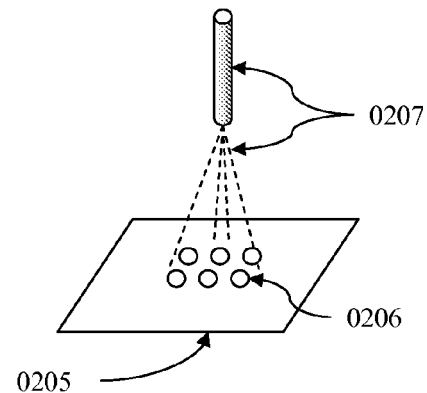
FIG. 2B illustrates schematically a set-up to define the desired pattern on the fluoropolymer by exposing to a high energy radiation
Figure 2C:
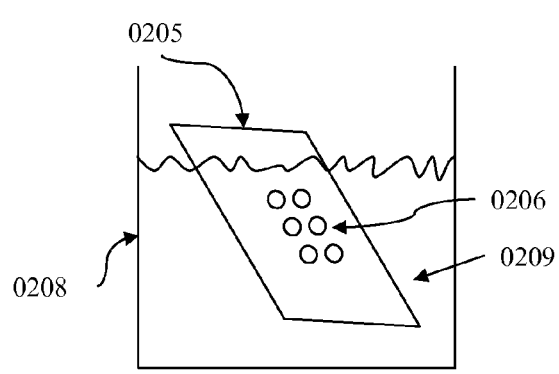
FIGS. 2C-2E are schematic representations showing possible methods of pattern development.
Figure 2D:
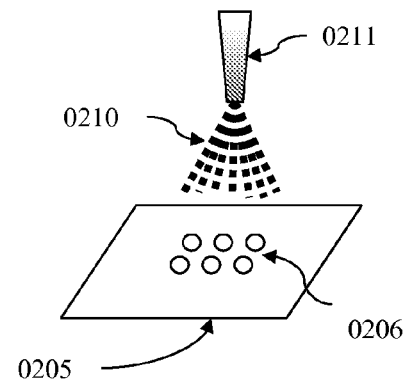
Figure 2E:
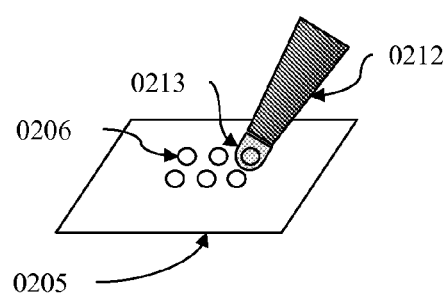
Figure 2F:
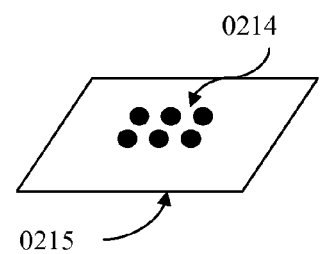
FIG. 2F shows schematically a patterned substrate after development.

First a solid surface (0100) is selected and cleaned (FIG. 1). In one aspect the solid substrate is transparent. In a preferred embodiment the transparent solid substrate is glass. In other embodiments the transparent solid substrate is quartz, mica or polymer. In another aspect the solid substrate is opaque including metal, semiconductor amorphous materials and ceramics. Second, the solid substrate can be coated with a thin layer of a conductive coating (0101). In one aspect the transparent conductive coating is an oxide. In a preferred embodiment the transparent coating is indium tin oxide (ITO). In other embodiments the transparent oxide is indium doped cadmium oxide (ICO), aluminum doped zinc oxide (ZnO:Al), gallium doped zinc Oxide (ZnO:Ga), indium doped zinc oxide (IZO) or zinc oxide (ZnO). In other aspects the conductive coating is graphene, carbon nanofiber, polymer or metal. Third, a thin layer of an amorphous fluoropolymer (0203) is deposited on the solid substrate coated with a thin conductive film (0200). In one aspect the amorphous fluoropolymer is Teflon AF 1600. In another aspect the amorphous fluoropolymer is Teflon AF 2400. In a preferred embodiment thin layer of the amorphous fluoropolymer is generated by spin-coating (FIG. 2A). In other embodiments the thin layer of amorphous fluoropolymer is generated by meniscus coating, capillary coating, extrusion coating, extrude-and-spin coating and patch coating. In a preferred embodiment the thickness of the amorphous fluoropolymer is 500 nm. In other embodiments the thickness of the amorphous fluoropolymer is in the range of 10 nm to 500 μm. Fourth, the substrate coated with amorphous fluoropolymer (0205) is exposed by a high energy radiation (0207) producing the desired pattern at exposed areas (0206) (FIG. 2B). In a preferred embodiment the high energy radiation is an electron beam, which is common equipment in most fabrication facilities. In other embodiments the high energy radiation is an X-ray beam, synchrotron radiation, laser radiation, or a focused ion beam. Finally, the exposed amorphous fluoropolymer film is developed with a fluorinated hydrocarbon solvent (0209). In a preferred embodiment the fluorinated hydrocarbon solvent is perfluoro (2-butyltetrahydrofuran), but the developer can comprise a variety of other perfluorinated solvents, including perfluoro-2-butyltetrahydrofuran ($C_8F_{16}O$), hexafluorobenzene ($C_6F_6$), perfluorodecalin ($C_{10}F_{18}$), 2H,3H-Decafluoropentane ($C_5H_2F_{10}$), benzotrifluorde ($C_7H_5F_3$), (trifluoromethyl)-, 1-butanamine, hexadecafluoroheptane ($C_7F_{16}$), Hexadecafluoro(1,3-dimethylcyclohexane), perfluoro-1,3-dimethylcyclohexane ($C_8F_{16}$), 2H,3H-Decafluoropentane octafluorotoluene ($C_7F_8$) and is perfluorooctyl bromide ($C_8BrF_{17}$). In another aspect the developer is a mixture of fluorinated hydrocarbon solvents in order to regulate the duration of the development process. Such a mixture can comprise, for example, perfluorononane and perfluoro-2-butyltetrahydrofuran ($C_8F_{16}O$) in a 1:1 (v/v) mixture. The exposed fluoropolymer coated substrates are brought in contact with the developer, until the exposed pattern is liberated from the amorphous fluoropolymer film. In a preferred embodiment the exposed surface is immersed, or dipped into fluorinated hydrocarbon solvent (FIG. 2C). In other embodiments the developer can be applied by spraying (FIG. 2D), or locally on selected substrate surface areas by a microflow needle or microfluidic device (FIG. 2E). During development, unexposed amorphous fluoropolymer is dissolved in the fluorinated hydrocarbon solvent, such that only the exposed areas (2015) remain on the substrate after development (FIG. 2F). Development can be controlled by adjusting development parameters. In one aspect, the temperature is regulated. Temperature can be increased to increase the solubility of the unexposed fluoropolymer in the developer. In another aspect, the developing time is regulated. For each amorphous fluoropolymer, an optimal development time has to be determined, in order to avoid over- or underdevelopment. In yet another aspect the substrate carrying the exposed amorphous fluoropolymer film is either held still, or is agitated, or is sonicated, in order to improve the contact between the developer liquid and the amorphous fluoropolymer film, and to facilitate the removal of dissolved material from the surface. After the development is complete, the substrates are washed, dried and characterized according to common fabrication procedures.

Example

Figure 4A:
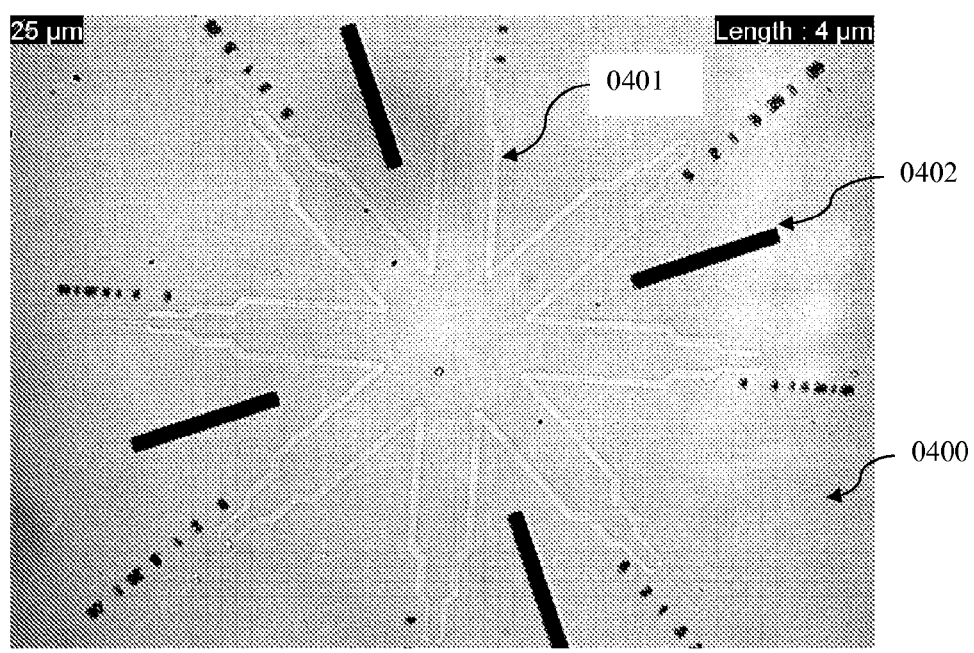
FIG. 4A shows an optical microscopy image of an e-beam exposed amorphous fluoropolymer-coated substrate after development.
Figure 4B:
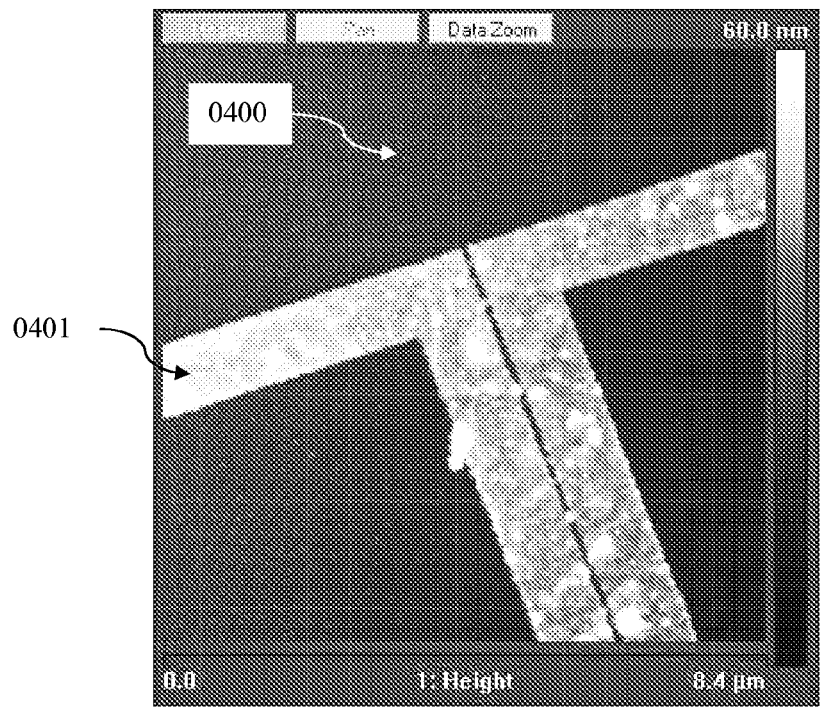
FIG. 4B shows an atomic force 2D micrograph of an e-beam exposed amorphous fluoropolymer-coated substrate after development.
Figure 4C:
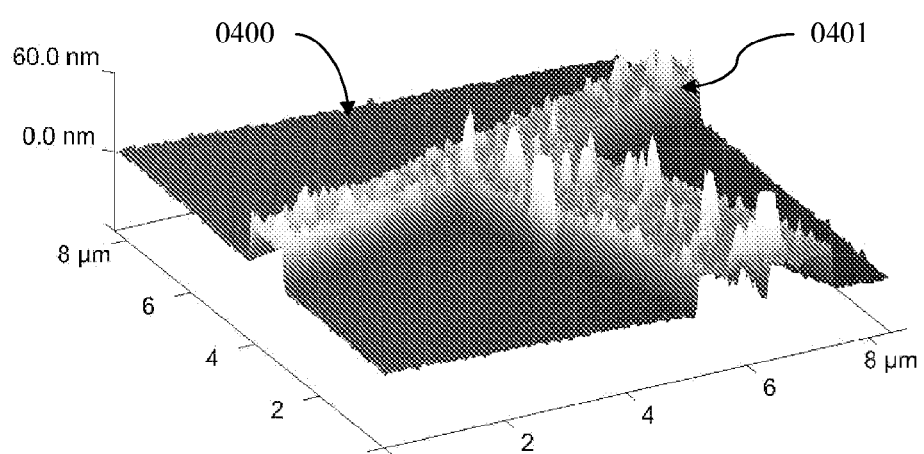
FIG. 4C shows atomic force 3D micrograph of an e-beam exposed amorphous fluoropolymer-coated substrate after development.

A non-limiting example of the invention is presented herein. FIG. 3 shows a thin layer of Teflon AF 1600 after exposure by e-beam radiation. The desired pattern on 500 nm thick Teflon AF 1600 film is exposed by 100 keV accelerated electron beam radiation with a 500-1500 $\mu C/cm^2$ dose range. In FIG. 3A, a micrograph of an exposed Teflon film on a ITO/glass substrate is displayed. Exposed areas are visible, due to the structural change in the exposed Teflon AF (0301), it can be distinguished from the unexposed Teflon AF (0300). Alignment marks (0302) help to locate the exposed regions. FIG. 3B is an AFM topography image of a locally exposed Teflon AF film. The unexposed areas (0300) appear bright, the exposed areas (0301) appear dark. The brightness encodes the absolute hight, showing a hight difference in the nanometer range between exposed and unexposed Teflon AF. After a 2 minute development at 20° C., subsequent to exposure, by means of perfluoro (2-buthyltetrahydrofuran), the e-beam exposed Teflon remains on the substrate while the unexposed Teflon has been removed by the developer solvent. FIG. 4A is a micrograph of the exposed, and subsequently developed Teflon film on a ITO/glass substrate. Exposed areas (0401) are visible as brighter areas, due to removed unexposed Teflon AF, easily distinguished from the uncoated substrate (0400). Alignment marks (0402) facilitate locating the exposed and developed pattern. FIG. 4B is a AFM 2D-topography image, and FIG. 4C a AFM 3D-topography image of an exposed and developed Teflon AF pattern. The developed pattern (0401) appears bright, and the substrate areas (0400) appear dark. The gap between the two exposed areas is ~50 nm wide.

Materials
Substrate:
Unbeveled, CNC (Computer Numerical Control) precision cut, thin borosilicate glass substrate (diameter: 50 mm (+/−0.25)×50 mm (+/−0.25); thickness: 0.175 mm (+/−0.015)) coated with ITO-coating (20+/−5 Ohms/sq.) with no $SiO_2$ layer from Präzisions Glas & Optik (Iserlohn, Germany)
Chemicals:
Teflon AF solution grade 601S2-100-6 1600 (6% (w/w) solids contents, based on Teflon AF1600, glass transition temperature Tg=160° C.) from Dupont Chemicals (Wilmington, US); HMDS (Hexamethyldisiloxane) from Micro Resist Technology GmbH (Berlin, Germany); Perfluoro (2-buthyltetrahydrofuran) from Tokyo Chemical Industry (Tokyo, Japan); Fluorinert FC-770 (CAS Number 86508-42-1) from Sigma Aldrich (Missouri, USA).
Equipment:
The Electron Beam Lithography system EBL-JEOL JBX-9300FS, from JEOL, Tokyo, Japan was used as radiation source for exposure. Electron Beam Evaporator (AVAC-HVC600) was used for the deposition of alignment marks. Dry plasma etching system (BatchTop PE/RIE m/95, PlasmaTherm/Advanced Vacuum, USA, was used for pre-treatment of the substrates. Standard clean-room fabrication methods and equipment was used for common substrate preparation steps.

Microscopy:
Scanning Electron microscope (Leo Ultra 55 FEG, Zeiss); AFM images were recorded using a Veeco Dimension 3100 SPM scanning probe microscope in tapping mode with a NSG01 DLC probe (NT-MDT Europe BV, Netherlands), The transmission optical micrographs were recorded using an Olympus reflected light optical microscope, with a LMPLFL50XBD objective, and a SONY ST50CCD Video camera.

Process
The ITO substrate was cleaned by spraying with acetone and subsequently isopropanol. To remove all the possible organic contaminants, the substrate was plasma treated (10 sccm oxygen, 500 mbar, 50 W) for 10 min. HMDS (Hexamethyldisiloxane) was spin-coated onto the substrate (3000 rpm) and baked on a hot plate (110° C. for 90 s) to improve the adhesion of Teflon to the substrate. Teflon AF 1600 (0203) was spin-coated (0202) onto the substrate (2000 rpm) and baked for 15 min at 180° C. beyond the glass transition temperature of Teflon AF. The substrate was then loaded into an electron beam lithography system (EBL-JEOL JBX-9300FS) where it was exposed by electron beam radiation (0207) using a pre-designed pattern. After exposure, the substrate was immersed in perfluoro (2-butyl tetrahydrofuran) (0209) in a glass container (0208). The unexposed surface area dissolved in the developer solvent, while the exposed pattern (0206) remained on the surface. After 2 min of development, the substrate was removed from the developer bath, washed with FC770, and dried by air blowing. The surfaces are stored under nitrogen.

REFERENCES

1. Amorphous fluoropolymers—A new generation of products. Korinek, p. M. 1994, Macromolecular symposia, pp. 61-65.
2. Micro- and Nano-Scale Fabrication of Fluorinated Polymers by Direct Etching Using Focused Ion Beam. Fukutake, N., et al. s.l.: Japanese Journal of Applied Physics, 2010, Vol. 49.
3. Direct Electron-Beam Patterning of Teflon AF. Karre, V., et al. 2, s.l.: Transactions on Nanotechnology, 2009, Vol. 8.
4. Nano- and micro-fabrication of perfluorinated polymers using quantum beam technology. Miyoshi, N., et al. s.l.: Radiation Physics and Chemistry, 2011, Vol. 80. 230-235.

What is claimed is:
1. A method for the one-step chemical development of an amorphous fluoropolymer pattern on a solid substrate, which was prior obtained by exposing selected surface areas on the substrate to high energy radiation, comprising applying a developer, which is selected from a group comprising liquid fluorinated hydrocarbons, to the fluoropolymer film, so that only the exposed area of the amorphous fluoropolymer layer remains on the substrate, while the unexposed amorphous fluoropolymer is dissolved in the developer.
2. The method of claim 1 wherein the fluorinated hydrocarbon solvent is selected from the group consisting of perfluoro(2-butyltetrahydrofuran) ($C8F16O$), hexafluorobenzene ($C6F6$), perfluorodecalin ($C10F18$), 2H,3H-Decafluoropentane ($C5H2F10$), benzotrifluorde ($C7H5F3$),

(trifluoromethyl)-, 1-butanamine, hexadecafluoroheptane (C7F16), Hexadecafluoro(1,3-dimethylcyclohexane).

* * * * *